(12) United States Patent
Manassen et al.

(10) Patent No.: US 12,092,966 B2
(45) Date of Patent: Sep. 17, 2024

(54) DEVICE FEATURE SPECIFIC EDGE PLACEMENT ERROR (EPE)

(71) Applicant: KLA Corporation, Milpitas, CA (US)

(72) Inventors: Amnon Manassen, Haifa (IL); Nadav Gutman, Zichron Ya'aqov (IL); Frank Laske, Weilburg (DE); Andrei V. Shchegrov, Campbell, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 18/386,846

(22) Filed: Nov. 3, 2023

(65) Prior Publication Data
US 2024/0168391 A1 May 23, 2024

Related U.S. Application Data

(60) Provisional application No. 63/427,518, filed on Nov. 23, 2022.

(51) Int. Cl.
*G01B 15/00* (2006.01)
*G01B 11/27* (2006.01)
*G03F 7/00* (2006.01)

(52) U.S. Cl.
CPC ...... *G03F 7/706845* (2023.05); *G01B 11/272* (2013.01); *G01B 15/00* (2013.01); *G03F 7/70655* (2023.05); *G01B 2210/56* (2013.01)

(58) Field of Classification Search
CPC ........... G03F 7/706845; G03F 7/70655; G01B 11/272; G01B 15/00; G01B 2210/56
See application file for complete search history.

(56) References Cited

U.S. PATENT DOCUMENTS

| | | | |
|---|---|---|---|
| 8,502,979 B2 | 8/2013 | Levy et al. | |
| 9,093,458 B2 | 7/2015 | Amir et al. | |
| 10,409,171 B2 | 9/2019 | Adel et al. | |
| 10,533,848 B2 | 1/2020 | Shchegrov et al. | |
| 10,571,811 B2* | 2/2020 | Amit | H01L 22/12 |
| 10,698,321 B2 | 6/2020 | Amir | |
| 11,248,905 B2* | 2/2022 | Amit | G06N 99/00 |
| 11,698,251 B2 | 7/2023 | Shchegrov et al. | |

(Continued)

OTHER PUBLICATIONS

Korean Intellectual Property Office, International Search Report and Written Opinion received in International Application No. PCT/US2023/079719, Mar. 8, 2024, 8 pages.

*Primary Examiner* — Hung V Nguyen
(74) *Attorney, Agent, or Firm* — Suiter Swantz IP

(57) ABSTRACT

A system and method are disclosed for generating metrology measurements with second sub-system such as an optical sub-system. The method may include performing a training and a run-time operation. The training may include receiving first metrology data for device features from the first metrology sub-system (e.g., optical); generating first metrology measurements (e.g., critical dimensions, etc.); binning the device features into two or more device bins based on the first metrology measurements; and identifying representative metrology targets for the two or more device bins based on distributions of the first metrology measurements. The run-time operation may include receiving run-time metrology data (e.g., optical) of the representative metrology targets; and generating run-time metrology measurements based on the run-time metrology data.

32 Claims, 8 Drawing Sheets

(56) References Cited

U.S. PATENT DOCUMENTS

| | | | |
|---|---|---|---|
| 11,874,605 B2 * | 1/2024 | Adel | G03F 7/70616 |
| 2006/0265145 A1 | 11/2006 | Huet et al. | |
| 2015/0324965 A1 | 11/2015 | Kulkarni | |
| 2016/0110857 A1 | 4/2016 | Plihal et al. | |
| 2017/0200265 A1 | 7/2017 | Bhaskar et al. | |
| 2019/0383754 A1 | 12/2019 | Zhang et al. | |

* cited by examiner

DEVICE FEATURE SPECIFIC EDGE PLACEMENT ERROR (EPE)

CROSS-REFERENCE TO RELATED APPLICATION

The present application claims the benefit under 35 U.S.C. § 119(e) of U.S. Provisional Application Ser. No. 63/427,518, filed Nov. 23, 2022, entitled DEVICE FEATURE SPECIFIC EDGE PLACEMENT ERROR (EPE), naming Amnon Manassen, Nadav Gutman, Frank Laske, and Andrei Shchegrov, which is incorporated herein by reference in the entirety.

TECHNICAL FIELD

The present disclosure relates generally to metrology and, more particularly, to determining device feature-relevant metrology.

BACKGROUND

Semiconductor fabrication typically requires fabricating multiple layers on a sample in which some or all of the layers include device features (e.g., features, transistors). Overlay metrology is the measurement of the relative positions of structures on various layers of a sample, which are crucial to the performance of device features and must typically be controlled within tight tolerances. The greater the overlay, the greater is the misalignment.

Dedicated overlay/metrology targets may be utilized to assist in improving alignment. For example, dedicated overlay targets may be diffraction gratings printed on multiple layers in an area separate from device features being formed, such as in a scribe line of the sample. The scribe line may define where the wafer is to be cut in a subsequent process. For example, a semiconductor wafer may comprise an array of dies, each of which may include many device features and be separated from other dies by the scribe lines.

Not all device feature layouts are amenable to direct overlay measurements. Further, overlay measurements may damage or otherwise affect the performance of device features. Accordingly, overlay measurements are commonly performed on dedicated overlay targets having features designed for sensitive overlay measurements rather than directly on device features. However, differences in size, orientation, density, and/or location on the sample of overlay targets relative to the device features may introduce a mismatch between measured overlay at the target and actual overlay of device features. Accordingly, ensuring device feature-relevant overlay measurements on overlay targets remains an ongoing challenge in overlay metrology.

Further, a critical dimension (CD) may be, for example, a lateral dimension of a feature when viewed in cross section such as a width of a gate or interconnect or a diameter of a hole. A CD may also be defined as, but is not limited to, an angle such as a sidewall angle.

Efforts to obtain device feature measurements of overlay or CD may typically be balanced with throughput requirements. For example, overlay targets with device feature-scale features may provide device feature-relevant overlay. However, device feature-scale features of device features are typically directly resolvable using particle-beam metrology tools such as, but not limited to, scanning electron microscopes (SEMs) that may be relatively slow and limit throughput in a production environment. In contrast, optical overlay metrology may provide higher throughput, but have a relatively lower resolution and not be capable of measuring device feature overlay directly, thus being more susceptible to errors.

Furthermore, the error tolerance budget (e.g., acceptable amount of overlay, CD, etc.) may be or become increasingly smaller and more difficult to achieve, especially for optical tools used in high throughput run-time operations. Even adjusting for non-zero offset (NZO) (e.g., adjusting for differences in measured overlay between after-development inspection (ADI) and after-etch inspection (AEI)), may not be enough to meet the stricter error budgets.

Actual/real overlay of device features may vary depending on the type of device feature. In current and future nodes, the range of distribution in actual overlay values of various device features may impede the achievement of error budgets.

Therefore, there exists a need for a system and method to provide accurate measurements that meet the error budgets, while still allowing for high throughput operations at scale.

SUMMARY

In another illustrative embodiment, the metrology system may also include one or more controllers communicatively coupled to the first metrology sub-system and the second metrology sub-system. In another illustrative embodiment, the one or more controllers may include one or more processors configured to execute program instructions configured to perform a training and a run-time operation. In another illustrative embodiment, the training may include receiving first metrology data for a plurality of device features from the first metrology sub-system, generating first metrology measurements of the device features based on the first metrology data, binning the device features into two or more device bins based on the first metrology measurements, and identifying representative metrology targets for the two or more device bins based on distributions of the first metrology measurements. In another illustrative embodiment, the run-time operation may include receiving run-time metrology data of the representative metrology targets on one or more run-time samples from the second metrology sub-system, and generating run-time metrology measurements of the representative metrology targets on the one or more run-time samples based on the run-time metrology data.

In a further aspect, the metrology system may also include determining a threshold breach based on a monitoring of the run-time metrology measurements and directing a transmission indicative of the threshold breach. In another aspect, the identifying of the representative metrology targets may involve designing the representative metrology targets or selecting them from a plurality of candidate representative metrology targets based on candidate target metrology data. In another aspect, the binning of the device features may involve identifying one or more sets of the device features based on one or more ranges of values of the first metrology measurements and binning the one or more sets of the device features into one or more outlier device bins.

In another aspect, the training and the run-time operation may be performed during after-etch inspection (AEI) or after-develop inspection (ADI). In another aspect, the second metrology sub-system may comprise a spectroscopic ellipsometer (SE) sub-system or any other suitable sub-system. In another aspect, the first metrology sub-system may comprise a scanning electronic microscope (SEM) sub-system. In another aspect, the binning of the device features may involve determining one or more device feature attribute distributions of the device features based on the first metrology measurements and binning the device features into the two or more device bins based on the one or more device feature attribute distributions.

In another aspect, the training may further include receiving optical calibration measurements of the representative metrology targets via the second metrology sub-system, verifying a correlation between the optical calibration measurements of the representative metrology targets and measurements of a device bin associated with the representative metrology targets, and determining a calibration between the optical calibration measurements and the measurements of the device bin associated with the representative metrology targets. In another aspect, the metrology system may be configured to provide correctables to a lithography tool to adjust a sample fabrication process based on the run-time metrology measurements corresponding to the representative metrology targets.

In another aspect, the designing of the representative metrology targets may involve designing a particular representative metrology target to comprise an array of repeating device features.

In another aspect, the one or more sets of the device features may comprise an outlier set based on an outlier range of the one or more ranges of the values of the first metrology measurements.

In another aspect, the outlier range may comprise an outlier range of CD values.

In another aspect, the outlier range may comprise an outlier range of OVL values.

In another aspect, a range of the one or more ranges may be based on a peak in a distribution of the values of the first metrology measurements.

In another aspect, two or more of the one or more ranges may each be based on a respective peak in a distribution of the values of the first metrology measurements.

In another aspect, the monitoring of the run-time metrology measurements for determining a threshold breach may involve monitoring a run-time edge placement error (EPE) distribution determined based on the run-time metrology measurements.

In another aspect, the second metrology sub-system may comprise at least one of several specified sub-systems, including an SE sub-system configured for multiple angles of illumination, an SE sub-system configured for measuring Mueller matrix elements, a single-wavelength ellipsometer sub-system, a beam profile ellipsometer sub-system, a beam profile reflectometer sub-system, a broadband reflective spectrometer sub-system, a single-wavelength reflectometer sub-system, an angle-resolved reflectometer sub-system, an imaging sub-system, or a scatterometer sub-system.

In another aspect, the correlation in the training process may comprise an ADI-to-AEI correlation between the optical calibration measurements and the measurements of the device bin, wherein the optical calibration measurements are configured to be after-develop inspection (ADI) measurements and the measurements of the device bin are configured to be after-etch inspection (AEI) measurements.

A metrology system is disclosed in accordance with one or more illustrative embodiments of the present disclosure. In one illustrative embodiment, the metrology system may include one or more controllers. In another illustrative embodiment, the controllers may include one or more processors configured to execute program instructions. In another illustrative embodiment, the program instructions may be configured to perform a training and a run-time operation. In another illustrative embodiment, the training may include receiving first metrology data for a plurality of device features from a first metrology sub-system, generating first metrology measurements of the device features based on the first metrology data, binning the device features into two or more device bins based on the first metrology measurements, and identifying representative metrology targets for the two or more device bins based on distributions of the first metrology measurements. In another illustrative embodiment, each of the representative metrology targets may be selected to provide that second metrology measurements based on second metrology data from a second metrology sub-system for the representative metrology targets are representative of the first metrology measurements of the device features in the corresponding two or more device bins. In another illustrative embodiment, the run-time operation may include receiving run-time metrology data of the representative metrology targets on one or more run-time samples from the second metrology sub-system, and generating run-time metrology measurements of the representative metrology targets on the one or more run-time samples based on the run-time metrology data.

A method for metrology is disclosed in accordance with one or more illustrative embodiments of the present disclosure. In one illustrative embodiment, the method may include performing a training and performing a run-time operation. In another illustrative embodiment, the training may include receiving first metrology data for a plurality of device features from a first metrology sub-system, generating first metrology measurements of the device features based on the first metrology data, binning the device features into two or more device bins based on the first metrology measurements, and identifying representative metrology targets for the two or more device bins based on distributions of the first metrology measurements. In another illustrative embodiment, the run-time operation may include receiving run-time metrology data of the representative metrology targets on one or more run-time samples from the second metrology sub-system, and generating run-time metrology measurements of the representative metrology targets on the one or more run-time samples based on the run-time metrology data.

In a further aspect, the method may include providing correctables to a lithography tool to adjust a sample fabrication process based on the run-time metrology measurements corresponding to the representative metrology targets.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Figure 1A:
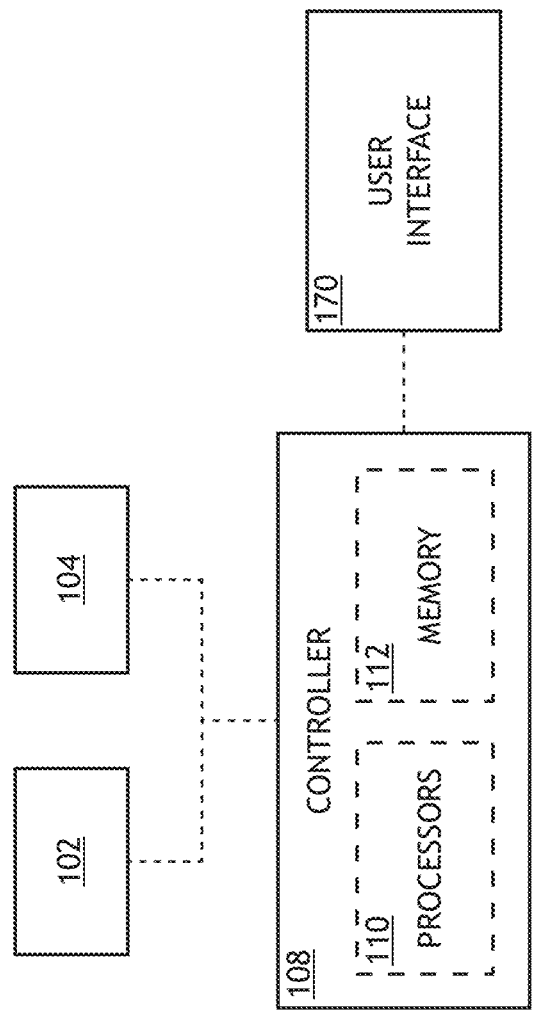
FIG. 1A is a conceptual view of a metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for binning device features (e.g., features of transistors, logic gates, etc.) into groups (e.g., device bins), identifying which target designs are representative of which device bins such that measurements of targets having such a target design may be used to predict measurements of the binned device features, and generating measurements of the binned device features by generating measurements of the representative metrology targets. For example—rather than metrology targets being used for approximating wafer-scale/chip-scale/region-scale measurements (e.g., overlay of a region)—metrology target designs that are device feature-relevant may be identified and paired with one or more device features to be used as a proxy to more accurately determine the measurements of such device features. Using targets corresponding to specific groups of device features allows for accounting for the differences in actual/real measurements of those device features, thereby enabling more accurate measurements and more specific process control adjustments to stay within more strict error budgets when fabricating a sample. This is different than a target that only accounts for the measurement of overlay as a whole, without consideration of specific device feature types. For example, high-throughput ADI optical metrology measurements may be correlated to high-resolution AEI metrology measurements to measure overlay of specific bins/groups of device features using corresponding representative targets specific to those bins/groups. In this regard, optical measurements of targets using a high-throughput second metrology sub-system may be used in a high-volume manufacturing (HVM) process at an after-develop inspection (ADI) step to predict overlay (OVL), critical dimension (CD), and/or edge placement error (EPE) measurements of device features at an after-etch inspection (AEI) step.

It is contemplated herein that actual measurements of OVL, CD, and/or EPE may be more accurately determined if, for example, device features are binned together and target designs correlated with such binned device features are identified. For example, some target designs may share the same (or similar) measurements and may therefore be used to predict measurements of certain device features, but other target designs may not necessarily be as consistently and/or accurately predictive for such device features. It should be noted that a variety of attributes may be used to bin device features. For example, device features may be binned based on one or more attributes such as, but not limited to, measurement (e.g., SEM measurement of device features at AEI such as overlay, critical dimension, or the like), tilt of the sample, location (e.g., distance from an edge of the device, scribe line, or the like), type (e.g., type of transistor, type of logic gate) of feature, shape of feature, size of feature, whether the feature is periodically repeated, which type of layer the feature appears in, or any other attributes. For instance, features of a certain shape (e.g., L shape next to two vertical lines as shown by feature #4 204d in FIG. 2A) located within a range (e.g., within 100 nanometers) from an edge of the device, and having SEM overlay measurements at AEI that are higher (on average) than other device features may be binned together in the hopes of identifying a representative metrology target design correlated to such device features. In this regard, a subset of device features that are binned may be correlated with a representative metrology target design. The one or more attributes may be used to define the device bin such that any other device features (e.g., device features of future manufactured samples, subsequent layers, non-measured device features) may be determined as being part of the device bin if they have such attributes.

Measurements of device features such as overlay, CD, and EPE may be useful in sample manufacturing and/or metrology processes. However, directly measuring the device features within a desired accuracy may damage the device features and/or require slow, expensive metrology techniques such as using a scanning electron microscope (SEM). Instead, targets (e.g., dedicated targets rather than electrically-functional devices) may be used to determine measurements.

A correlation may exist, at least in some samples, between measurements of device features and measurements of targets such that target measurements may be used to predict the measurements related to device features. For example, systems and methods for generating device-relevant overlay measurements by adjusting optical overlay measurements of targets with device-relevant corrections may be disclosed in U.S. Pat. No. 10,533,848, entitled METROLOGY AND CONTROL OF OVERLAY AND EDGE PLACEMENT ERRORS, filed on Aug. 7, 2018, which is incorporated herein by reference in its entirety.

Further embodiments of the present disclosure are directed to generating run-time metrology measurements. For example, run-time metrology measurements may be metrology measurements obtained at run-time, which may mean during a sample manufacturing process such as a HVM process. In this regard, the second metrology sub-system may capture data directly on samples during fabrication temporally proximate to the development step without damaging the samples. Further, identifying potential issues at this stage may facilitate reworking of samples in the current or future lots to correct the issues prior to a time-consuming and irreversible etching step. In some examples, target overlay measurements associated with a current process step optically measured on a sample may be used (e.g., used as overlay correctables) to compensate for drifts and maintain overlay within selected tolerances for the process step on subsequent samples in the same or subsequent lots. By way of another example, overlay measurements associated with a current process step may be fed-forward to adjust subsequent process steps to compensate for any measured overlay errors. Systems and methods for generating device-relevant overlay measurements by adjusting optical overlay measurements with device-relevant corrections and overlay correctables may be disclosed in U.S. Pat. No. 10,533,848, entitled METROLOGY AND CONTROL OF OVERLAY AND EDGE PLACEMENT ERRORS, filed on Aug. 7, 2018, which is incorporated herein by reference in its entirety.

Multiple metrology sub-systems may be used at various stages of training and/or runtime (e.g., optical and/or SEM metrology sub-systems). For example, for purposes of distinguishing only, the terms "first" and "second" may be used. For example, a first metrology sub-system (e.g., first metrology sub-system 102 of FIG. 1C) and a second metrology sub-system (e.g., second metrology sub-system 104 of FIG. 1B) may be used. For instance, the first metrology sub-system may, but is not necessarily required to be, a higher resolution and low volume (e.g., slower) sub-system such as an SEM to allow for accurately determining data used to generate overlay, CD, and/or EPE. In contrast, the second metrology sub-system may, but is not necessarily required to be, a lower resolution and higher volume sub-system, such as an optical sub-system. The first metrology sub-system may allow for measurements during a training step, while the second metrology sub-system may be used during run-time for high-volume processing of samples. In this way, sub-systems of different resolutions and throughput may be used to leverage respective strengths during training and during run-time operations.

Second metrology sub-systems may provide high-throughput measurements suitable for in-line process control. For example, second metrology sub-systems may utilize imaging-based optical overlay methods to simultaneously image features on multiple sample layers and determine overlay based on relative displacements between the features. By way of another example, scatterometry-based optical metrology may determine overlay using a model-based approach in which light scattered and/or diffracted from the sample is compared to expected patterns based on known sample features such as, but not limited to, grating structures in overlapping layers. In another example, CD targets may be imaged by imaging-based optical CD methods. The features of targets suitable for optical characterization may be segmented to provide multiple measurement points within a single field of view, which may facilitate highly precise measurements with low noise based statistical averaging of repetitive structures. Further, second metrology sub-systems may provide, but are not necessarily required to provide, measurements on the order of 0.2 to 1 second per site and may thus provide substantial flexibility for the frequency of measurements per sample and per lot in a production line.

For purposes of the present disclosure, the term "optically-resolvable" indicates that at least a portion of the features are resolvable with a selected second metrology sub-system within selected tolerances. Examples of optically-resolvable features may include, but are not limited to, grating patterns of dedicated overlay targets located in a scribe line of a wafer which are resolvable/measurable with image-based overlay (1130) metrology methods. For example, optically-resolvable targets may be on the order of more than 10 microns (e.g., 30 microns) in size.

Further, "device feature-scale" features may include one or more characteristics (e.g., line-widths, separation distances between features, or the like) similar to device features to be incorporated into a fabricated device feature. Examples of a "device feature" may include, but are not limited to, functional features such as transistors, logic gates, etc. of a die of multiple dies of a wafer. Device features are typically smaller than optically-resolvable targets and are not generally directly optically-resolvable. For example, at least some characteristics of device feature-scale features may be on the order of less than 3 microns in size and first metrology sub-systems may include tools being defined as having, for example, a resolution of less than a micron, less than 10 nanometers, between 0.5 and 4 nanometers, or the like. It is recognized herein that certain device features may be at least partially resolvable by the selected second metrology sub-system, but may further contain characteristics below the resolution of the selected second metrology sub-system. It is to be understood that the terms "optically-resolvable" features and "device feature-scale" features and the like are illustrative and are not intended to limit the size, orientation, or distribution of any patterned features on the sample. Some targets such as hybrid overlay targets may allow for both optically-resolvable measuring and device feature-scale measuring of the hybrid overlay targets. In embodiments, the plurality of target designs are a plurality of hybrid overlay target designs.

Directly measuring device features may, at least for some particle-based metrology tools, cause damage to the device features themselves. Embodiments of the present disclosure allow for the benefits of measuring targets using relatively fast optical-based methods and making adjustments to those optical measurements to estimate measurements of device features without directly measuring the device features themselves. Benefits of such embodiments may allow for improved reliability of device features by optically measuring targets instead of measuring the device features in a potentially damaging way.

It should be noted that edge placement error (EPE), for purposes of the present disclosure is defined as being a function of overlay and CD. For example, EPE may be defined as the average of overlay and CD (i.e., ½×(overlay+CD)).

FIGS. 1A through 1C, and FIGS. 3 and 4 generally illustrate a system and method for providing run-time metrology measurements, in accordance with one or more embodiments of the present disclosure. In embodiments, the system and method may be used to augment existing methods of metrology of samples by providing a cost-effective manner for monitoring measurements of the device features.

FIG. 1A illustrates a conceptual view of a metrology system 100, in accordance with one or more embodiments of the present disclosure. The metrology system 100 may include, but is not limited to, a second metrology sub-system 104 and/or a first metrology sub-system 102. The metrology system 100 may additionally include, but is not limited to, a controller 108. In embodiments, the controller 108 includes one or more processors 110 configured to execute program instructions maintained on a memory 112. In this regard, the one or more processors 110 of controller 108 may execute any of the various process steps described throughout the present disclosure. For example, the controller 108 may receive data from any of the second metrology sub-system 104 or the first metrology sub-system 102 and may further generate run-time metrology measurements. The metrology system 100 may be configured to measure one or more samples (e.g., sample 118 of FIG. 1B), but does not necessarily comprise the samples.

In embodiments, the first metrology sub-system 102 may be configured for a first resolution and first throughput. The second metrology sub-system 104 may be configured for a second resolution (e.g., spatial resolution) and second throughout (e.g., measurements per second). For example, the second resolution and the second throughout may be different than the first resolution and the first throughput. For example, the first resolution may be higher (e.g., more accurate, higher spatial resolution) than the second resolution and the first throughput may be lower than the second throughput. For instance, the second resolution may be configured (e.g., capable of) resolving at least a measurement of a target (e.g., optically-resolvable target) and the second resolution may be configured (e.g., capable of) resolving at least a device feature for overlay and/or CD purposes.

Figure 1B:
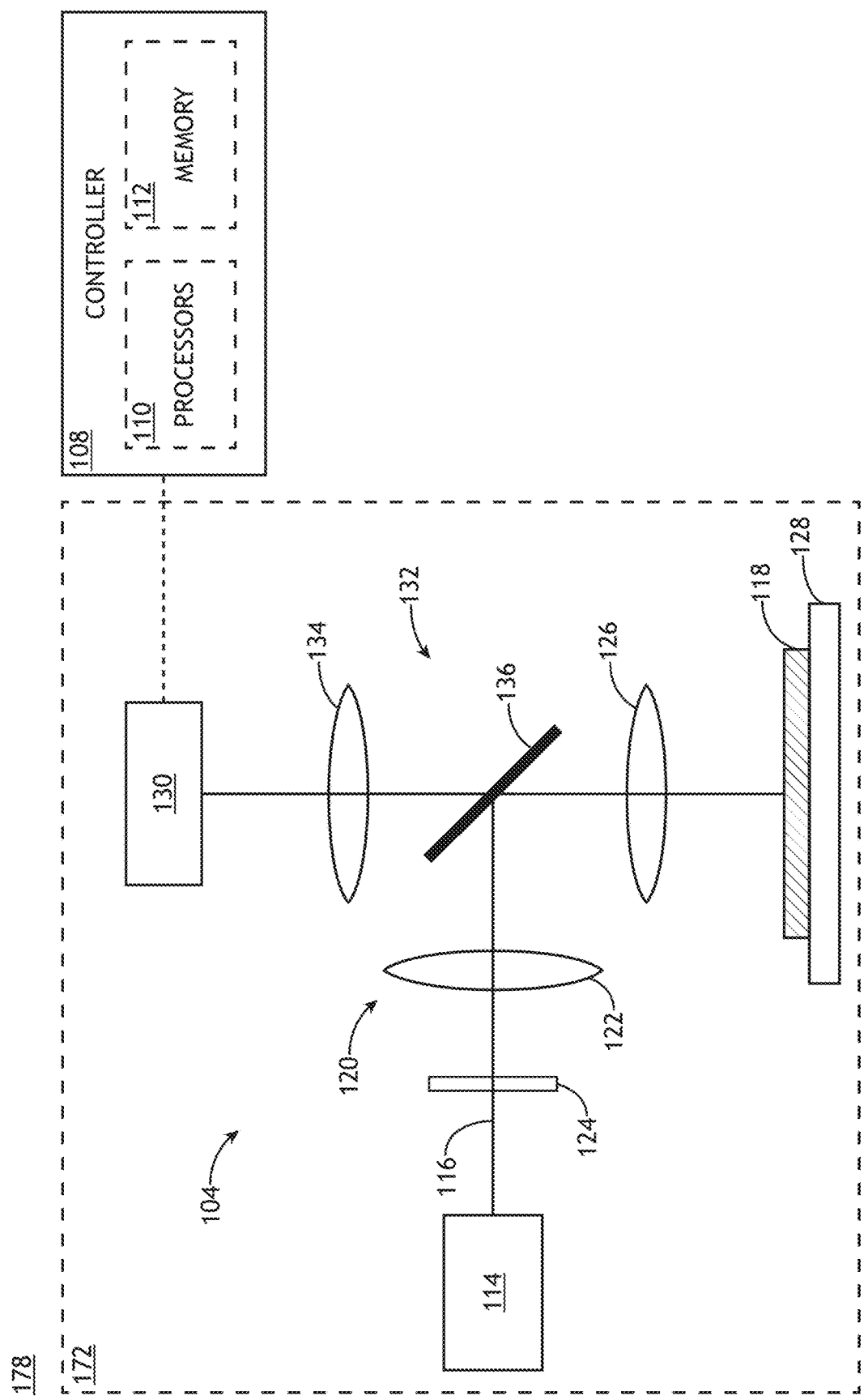
FIG. 1B is a conceptual view of an optical metrology tool, in accordance with one or more embodiments of the present disclosure.

In embodiments, the second metrology sub-system 104 includes optical metrology sub-system 172 of FIG. 1B and the first metrology sub-system 102 includes a device feature-resolvable sub-system. For example, the device feature-resolvable sub-system may include particle-beam metrology sub-system 174 of FIG. 1C. It should be noted that while the first metrology sub-system 102 may be described in regards to particle-beam metrology sub-systems 174 of FIG. 1C such as a scanning electron microscope (SEM) metrology sub-system, that the first metrology sub-system 102 may, alternatively or in addition, include a soft x-ray (SXR) metrology sub-system configured to measure a sample using electromagnetic radiation in the soft X-ray spectral range. For example, an SXR metrology sub-system may be utilized to measure a plurality of AEI device feature measurements of a plurality of device features.

A "tool" (e.g., metrology tool, first tool such as a particle-beam metrology tool 176, second tool such as an optical metrology tool 178, and the like) may be a sub-system coupled to a controller 108. For example, controller 108 of FIG. 1B may be the same controller as controller 108 in FIG. 1A or 1C or a different controller. For example, optical metrology tool 178 may include optical metrology sub-system 172 and controller 108. In another example, particle-beam metrology tool 176 may include particle-beam metrology sub-system 174 and controller 108.

FIG. 1B is a conceptual view of optical metrology tool 178, in accordance with one or more embodiments of the present disclosure. In embodiments, optical metrology tool 178 includes an optical metrology sub-system 172. The optical metrology sub-system 172 may be any sub-system used in the art suitable for generating measurements based on optically-resolvable features. For example, the optical metrology sub-system 172 may be an example of a second metrology sub-system 104 and may include any type of optical overlay metrology sub-system known in the art suitable for generating optical overlay data associated with two or more layers of a sample 118 such as, but not limited to, an image-based optical metrology sub-system or a scatterometry-based optical metrology sub-system.

The second metrology sub-system 104 may include an optical sub-system used to receive/measure metrology data of samples 118 optically (e.g., using wavelengths of light), rather than a scanning electron microscope. For example, the second metrology sub-system 104 may include a spectroscopic ellipsometer (SE) sub-system.

In embodiments, the second metrology sub-system 104 may include at least one of: an SE sub-system configured for multiple angles of illumination; an SE sub-system configured for measuring Mueller matrix elements; a single-wavelength ellipsometer sub-system; a beam profile ellipsometer sub-system; a beam profile reflectometer sub-system; a broadband reflective spectrometer sub-system; a single-wavelength reflectometer sub-system; an angle-resolved reflectometer sub-system; an imaging sub-system; or a scatterometer sub-system.

Figure 1C:
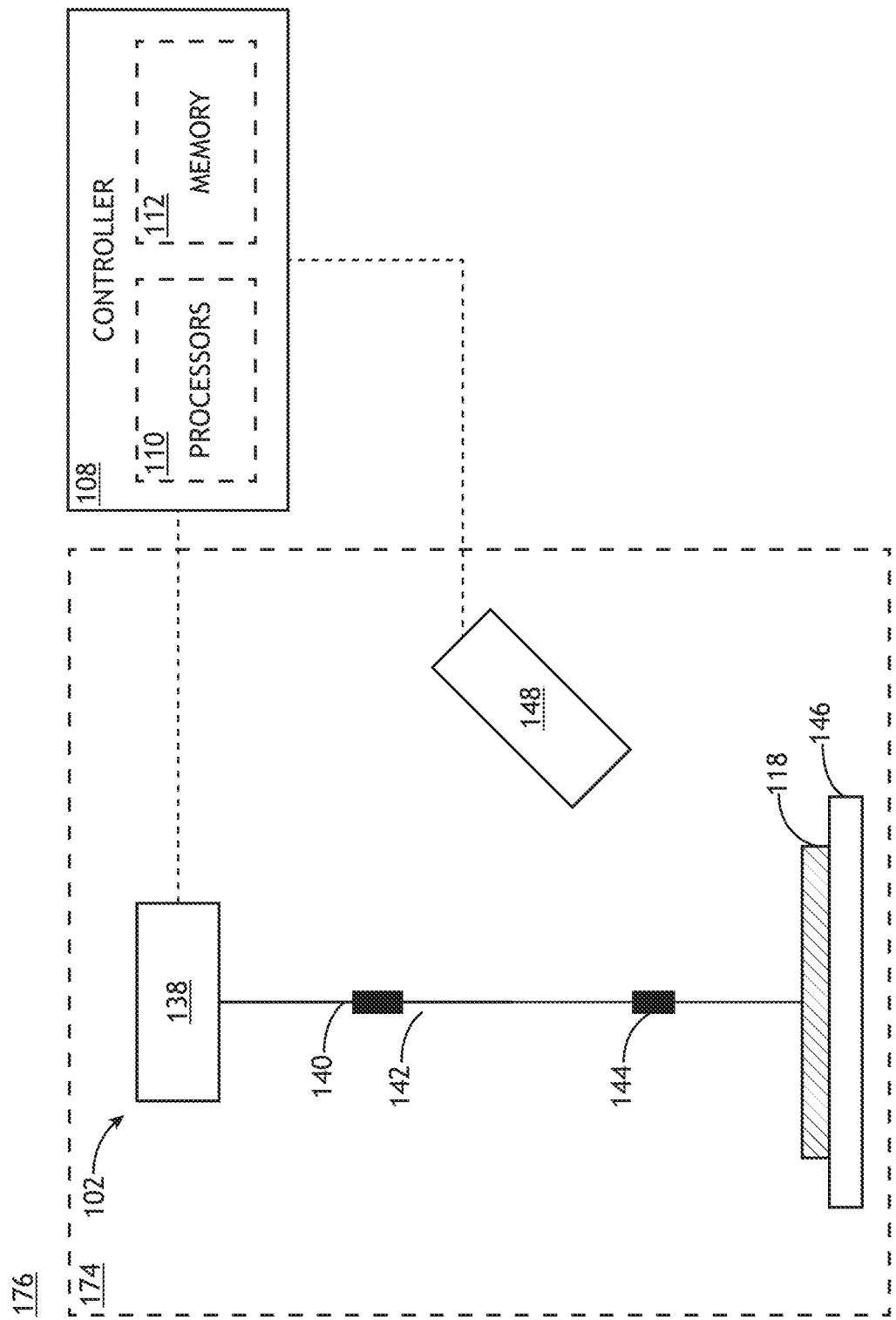
FIG. 1C is a conceptual view of a particle-beam metrology tool, in accordance with one or more embodiments of the present disclosure.

FIG. 1C is a conceptual view of a particle-beam metrology tool 176, in accordance with one or more embodiments of the present disclosure. In embodiments, a particle-beam metrology tool 176 includes a particle-beam metrology sub-system 174. The particle-beam metrology sub-system 174 may be an example of a first metrology sub-system 102 and may include, for example, any type of metrology tool suitable for resolving device features or device feature-scale features of targets using particle-beam technology such as, but not limited to, a scanning electron microscope (SEM) metrology tool.

Referring back to FIG. 1A, the second metrology sub-system 104 may provide measurements (e.g., optical measurements) of one or more targets and the first metrology sub-system 102 may provide measurements suitable for determining measurement-calibration adjustments to the optical measurements. Further, the metrology system 100 may utilize any component (e.g., the second metrology sub-system 104, the first metrology sub-system 102) at any selected frequency in a production line (at run-time) to balance measurement accuracy and throughput requirements. For example, the second metrology sub-system 104 may be used for in-line measurement monitoring, while the first metrology sub-system 102 may be selectively used at lower frequencies to determine measurement-calibration adjustments to the optical measurements provided by the second metrology sub-system 104.

Figure 2A:
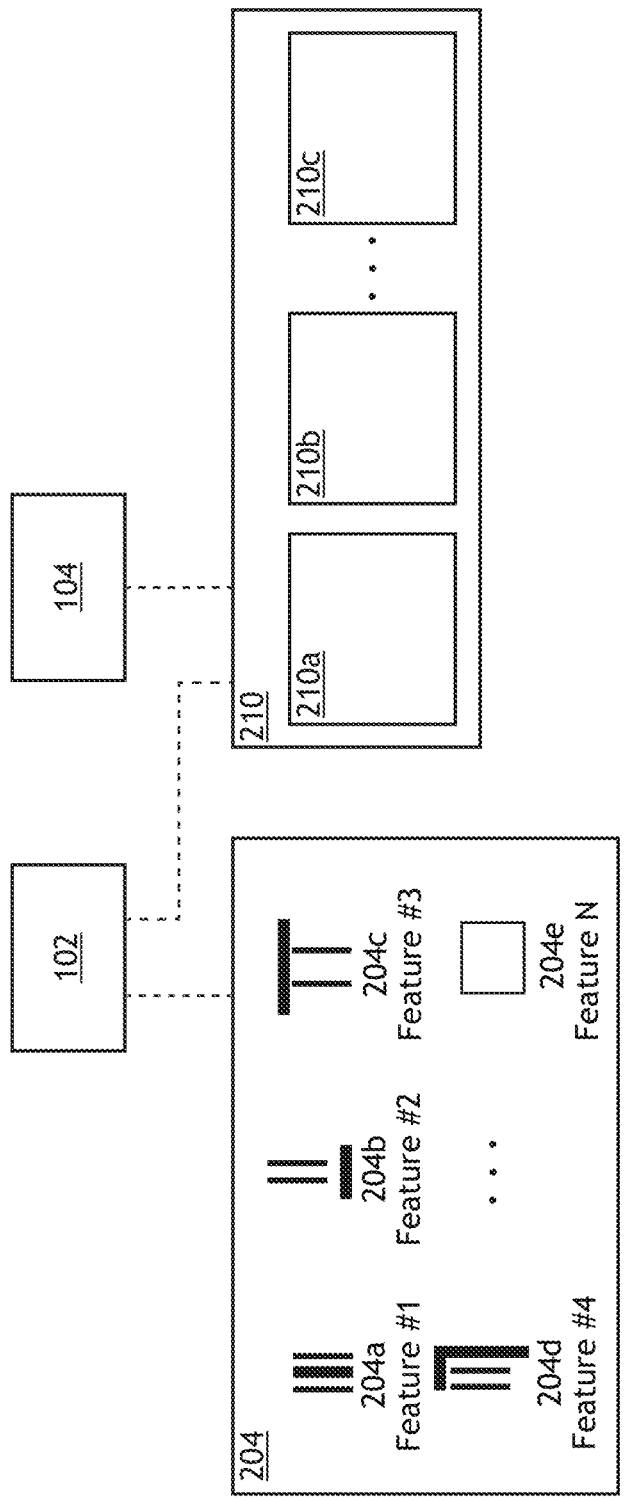
FIG. 2A is a conceptual view of utilization of various tools of a metrology system for measuring, in accordance with one or more embodiments of the present disclosure.

FIG. 2A illustrates a conceptual view of a utilization of various sub-systems of a metrology system 100 for measuring device features 204 and targets 210, in accordance with one or more embodiments of the present disclosure. For example, the first metrology sub-system 102 may be configured (e.g., configured via properties such as resolution (e.g., spatial resolution), wavelength, field of view, program instructions stored on memory, etc.) to measure both device features 204 and targets 210 as shown and the second metrology sub-system 104 may be configured to image targets 210.

In embodiments, device features 204 are binned (e.g., before binning steps 306, 604) based on location (e.g., location in a die; proximity to other components, devices, etc.; and/or the like).

In embodiments, device features are binned based on shape (e.g., feature #, L shape, square shape, etc.).

In embodiments, device features are binned based on measurements (e.g., overlay, CD, and/or EPE).

In embodiments, device features are binned based on device type (e.g., transistor type, logic gate type such as NOR gate, and the like).

Figure 3:
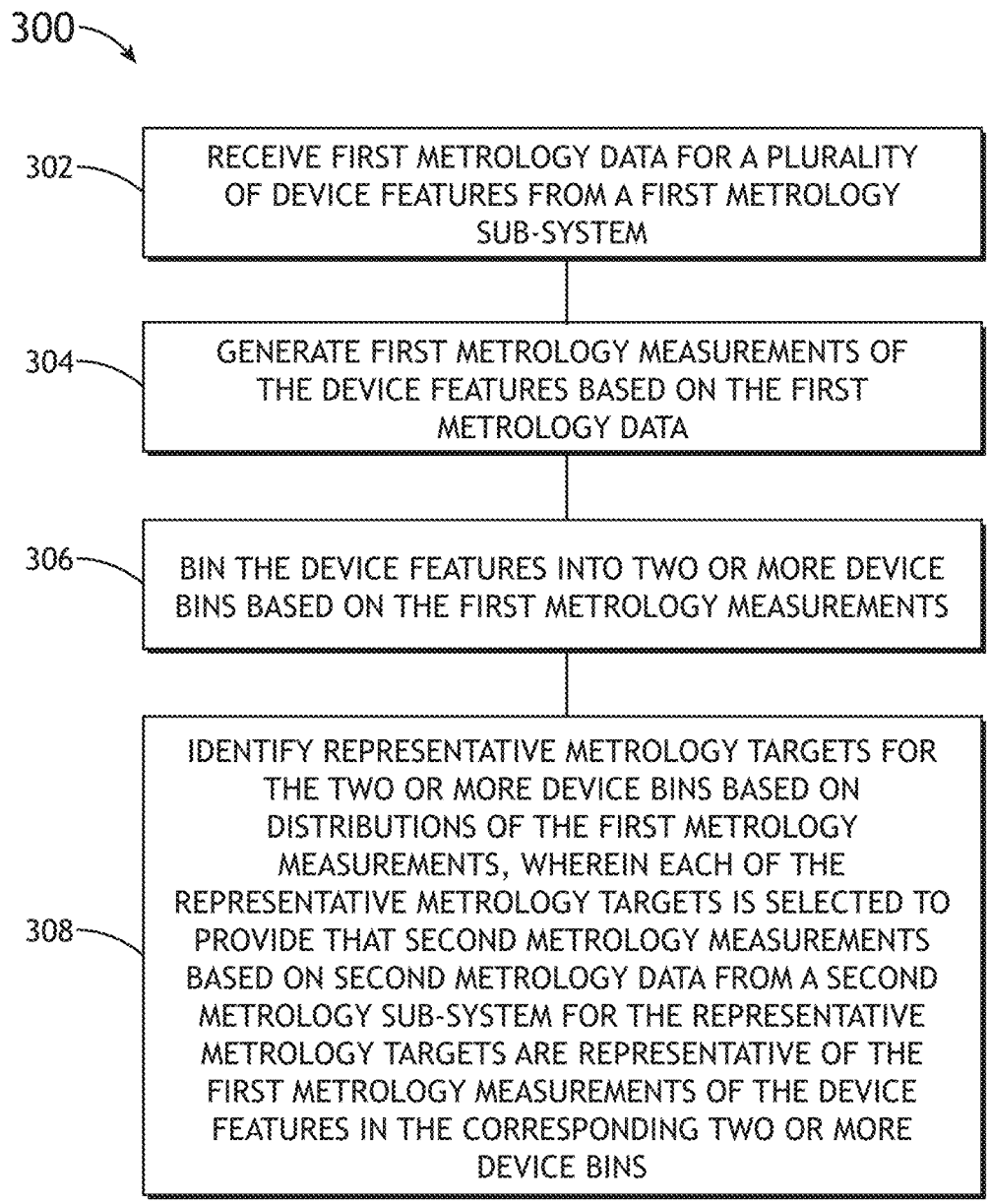
FIG. 3 is a flow diagram illustrating steps performed in a method for training, in accordance with one or more embodiments of the present disclosure.

FIG. 3 is a flow diagram illustrating steps performed in a method 300 for performing a training, including identifying representative metrology targets, in accordance with one or more embodiments of the present disclosure. For example, training may include identifying which targets 210 may be representative metrology targets of which device bins 212. It is noted that the embodiments and enabling technologies described herein in the context of metrology system 100 should be interpreted to extend to method 300 and other methods herein (e.g., method 400, method 500). It is further noted, however, that the method 300, the method 400, and the method 500 are not limited to the architecture of metrology system 100.

In a step 302, first metrology data for a plurality of device features 204 from a first metrology sub-system 102 is received.

In a step 304, first metrology measurements are generated of the device features 204 based on the first metrology data.

In a step 306, the device features 204 are binned into two or more device bins 212 based on the first metrology measurements.

In embodiments, device features may be binned using one or more attributes (e.g., measurement distribution, location, shape, etc.).

The binning may include: determining device feature attribute distributions of the device features based on the first metrology measurements; and binning the device features into the device bins based on the one or more device feature attribute distributions.

For example, the device feature attribute distributions may include sample tilt (i.e., an angular tilt of a sample 118) distributions. For instance, accounting for the tilt may allow for improved (e.g., more accurate) device binning and/or identifications of representative metrology targets.

For example, the device feature attribute distributions may include distributions of OVL distributions, CD distributions, and/or edge placement error (EPE) distributions. For instance, several device features with similar CD values (e.g., values above an 80th percentile threshold) may be binned together.

For instance, device features may belong to a feature type group. Different feature type groups may be illustrated by feature numbers (e.g., feature #1 204a, feature #2 204b, feature #3 204c, feature #4 204d, up to any number of feature type groups such as a feature #N 204e), where each feature type group may include many (e.g., dozens, thousands, billions) of device features having a shape associated with that feature type group. For example, a particular logic gate structure used in a wafer die may be associated with a particular feature type group.

The binning may include identifying one or more sets of the device features 204 based on one or more ranges of values of the first metrology measurements; and binning the one or more sets of the device features 204 into one or more outlier device bins 212. For example, FIG. 2C illustrates outlier device bin 212d of device feature #1 204a.

The one or more sets of the device features may include an outlier set based on an outlier range of the one or more ranges of the values of the first metrology measurements. For example, any threshold may be used to determine an outlier set. For instance, the values above an outlier threshold (e.g., $90^{th}$ percentile threshold) may be used as a cutoff such that all features above (or, alternatively, below) a threshold may be binned together. In this example, the range is defined by the range of values above the $90^{th}$ percentile. A range may be defined between any percentiles, standard deviation multiples, and/or the like.

The outlier range may include an outlier range of CD values. The outlier range may include an outlier range of OVL values. A range may be based on a peak in a distribution of the values of the first metrology measurements. For example, rather than a simple bell curve, a distribution of values may appear with multiple peaks, like a sinusoidal curve. Each peak/crest of the curve indicates a cluster of device features that have similar values and therefore, may benefit from a representative target to be used as a proxy to measure their values. Two or more ranges may each be based on a respective peak in a distribution of values.

In a step 308, representative metrology targets are identified for the two or more device bins 212 based on distributions of the first metrology measurements. For example, identifying may include designing the representative metrology targets or selecting the representative metrology targets from candidate representative metrology targets.

In embodiments, the representative metrology targets are designed. For example, the representative metrology targets may be designed using software using one or more design methodologies. For instance, any methodology may be used. For instance, a particular representative metrology target may be designed as an array of repeating device features. For instance, a device feature may be repeated as a grid of rows and columns. For example, the number of rows and/or columns may be more than 10. For example, the number of rows and/or columns may be more than 100. For example, the number of rows and/or columns may be more than 1000. In this way, the device features themselves of a device bin are used as a basis to design the representative metrology targets. By way of another instance, the design may include performing an analysis to predict and/or curate attributes of the representative metrology targets to be representative of the binned device features. For example, predicting may include simulating, machine learning predictions, selecting from attributes of historic metrology targets stored in memory, and/or any other way of predicting or generating the measurements of (designed) representative metrology targets.

In embodiments, identifying the representative metrology targets includes: receiving candidate target metrology data of a plurality of candidate representative metrology targets; and selecting the representative metrology targets from the plurality of the candidate representative metrology targets based on the candidate target metrology data. For example, one or more candidate representative metrology targets may be configured to be selected from using a controller 108. For instance, a candidate representative metrology target may be selected to provide that second metrology measurements based on second metrology data from the second metrology sub-system for the representative metrology targets are representative of the first metrology measurements of the device features in the corresponding two or more device bins. For example, candidate target metrology data may be received and used to generate candidate target metrology measurements. For instance, received in this particular context may mean received from first metrology sub-system 102 and/or second metrology sub-system 104. In another instance, historic data (e.g., fetched from memory and known a priori) of candidate representative metrology targets may be used.

Figure 4:
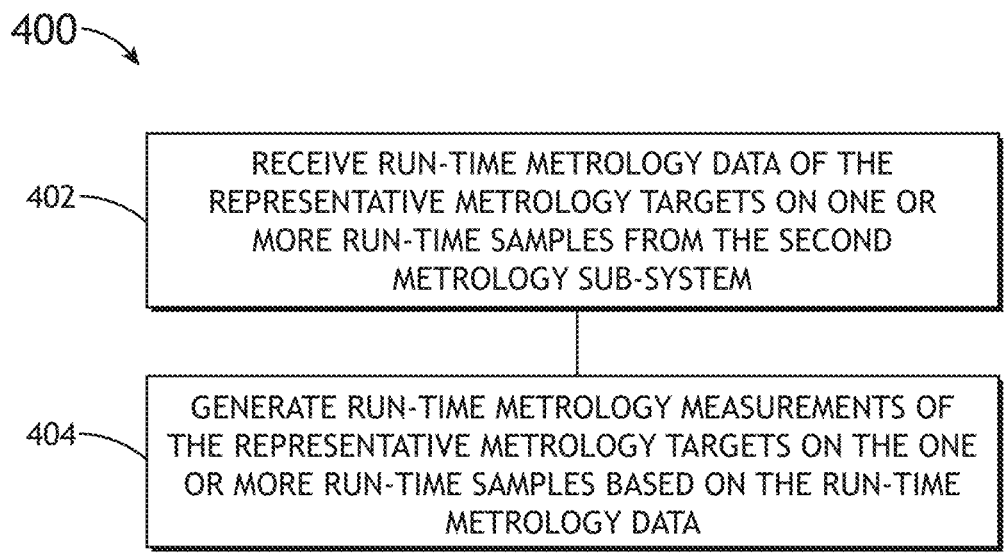
FIG. 4 is a flow diagram illustrating steps performed in a method for run-time operation, in accordance with one or more embodiments of the present disclosure.

FIG. 4 is a flow diagram illustrating steps performed in a method 400 for performing a run-time operation, in accordance with one or more embodiments of the present disclosure. For example, after representative metrology targets are identified in the training of method 300, method 400 may facilitate high-throughput measurements of samples 118 during a manufacturing process of the samples 118.

In a step 402, run-time metrology data is received of the representative metrology targets on one or more run-time samples from the second metrology sub-system.

The run-time operation may be configured to be performed during ADI. For example, both training and run-time may be performed in ADI. In another example, the training may be configured to be performed AEI, and the run-time operation performed during ADI. For instance, the training may be configured to be performed during AEI and the run-time operation may be configured to be performed during ADI using an optical second metrology sub-system 104.

The run-time operation may be configured to be performed during after-etch inspection (AEI). For example, both training and run-time may be performed in AEI. For example, the training may be configured to be performed during after-develop inspection (ADI), and the run-time operation performed during AEI.

In a step 404, run-time metrology measurements are generated of the representative metrology targets on the one or more run-time samples 118 based on the run-time metrology data.

In another step, a threshold breach is determined based on a monitoring of the run-time metrology measurements; and a transmission is directed (to be sent by controller 108) indicative of the threshold breach. For example, when a distribution of run-time metrology measurements is above a threshold (e.g., known threshold such as a user selected threshold of acceptable values), the controller 108 may be configured to direct a transmission (e.g., transmit or command a transmission to be sent). For instance, the transmission may include an alert configured to be viewed by a user or a command configured to stop the run-time operation. In this way, optical run-time metrology measurements may be used to monitor a sample 118 manufacturing process and keep the process within a threshold. For example, run-time edge placement error (EPE) distributions may be monitored. For example, run-time CD distributions may be monitored. For example, run-time overlay distributions may be monitored.

The training may include calibrating, which may include receiving information (e.g., calibration measurements), verifying a correlation of the representative metrology targets to the device bins, and using the received information to determine a calibration function to be used during run-time.

For example, the training may include receiving optical calibration measurements of the representative metrology targets via the second metrology sub-system 104. The run-time metrology measurements of the representative metrology targets may correlate, but not perfectly match, the actual/real measurements of actual device features. If the correlation is strong and predictable enough, as may be determined via verification, then the verified representative metrology targets may be safely used.

For example, the training may include verifying a correlation between the optical calibration measurements of the representative metrology targets and measurements of a device bin 212 associated with the representative metrology targets. For instance, the optical calibration measurements may be compared with measurements of device features (e.g., first metrology measurements) to determine whether they are correlated. The correlation may be verified over a range of values. For example, a measured value of 10.00, 11.00, and 12.00 may correlate to second actual values of 10.11, 11.14, and 12.09. As shown the second values are roughly 10% higher, and if the measured values are multiplied by 1.10, then they will closely match the second actual values. In examples, if the difference is within a verification threshold, then a correlation is confirmed/verified. If not, a different representative metrology target may be identified. This correlation/verification may be important.

For example, the training may include determining a calibration (e.g., calibration function, offset value, and/or the like) between the optical calibration measurements and the measurements of the device bin 212 associated with the representative metrology targets, such that the calibration may be applied to generate more accurate run-time metrology measurements. For instance, determining a calibration may be based on a difference between the optical calibration measurements of representative metrology targets and the measurements of the device bin 212 associated with the representative metrology targets. For example, the calibration may include an offset value (e.g., where a value N should be equal to N+offset) or linearly mismatched (e.g., such that N should be 1.10N). The calibration may be determined using any method known for calibrating. For example, differences between linear regression fits of each of sets of numbers may be used to determine the calibration.

In embodiments, the correlation includes an ADI-to-AEI correlation between the optical calibration measurements and the measurements of the device bin 212. The optical calibration measurements may be configured to be after-develop inspection (ADI) measurements and the measurements of the device bin may be configured to be after-etch inspection (AEI) measurements. For example, if the representative metrology targets are identified based on SEM second metrology sub-system measurements in AEI, but a user wishes to monitor EPE distributions in ADI, then a controller 108 may be configured to calibrate and verify a correlation between optical ADI measurements of the representative metrology target and SEM measurements of the corresponding binned device features in AEI. In this way, high-throughput optical imaging (e.g., second metrology sub-system 104 imaging) in ADI (i.e., before etching) may be used to predict AEI (i.e., after etching) device feature distributions.

Figure 2B:
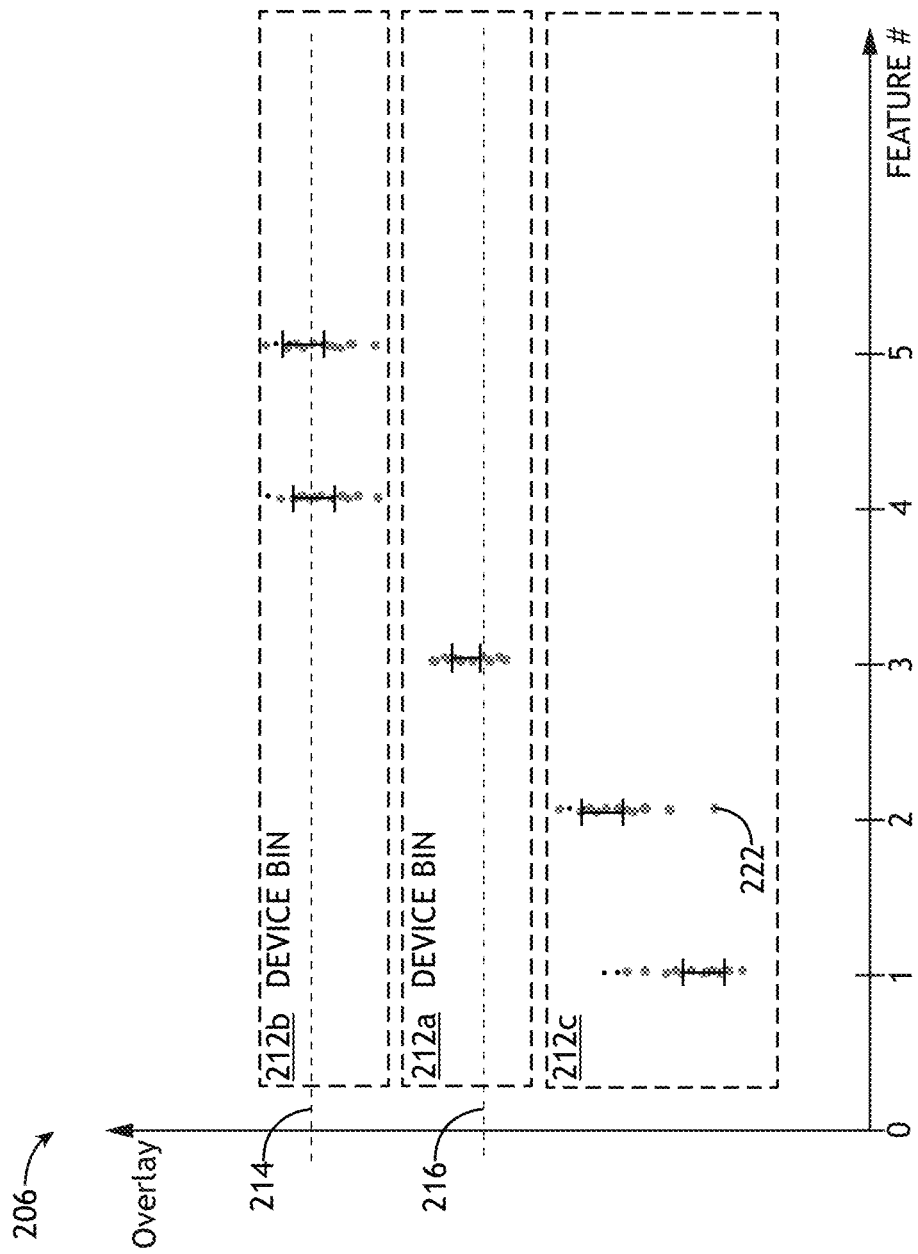
FIG. 2B is a conceptual view of device bins in the context of a plot of overlay measurements of device features, in accordance with one or more embodiments of the present disclosure.
Figure 2C:
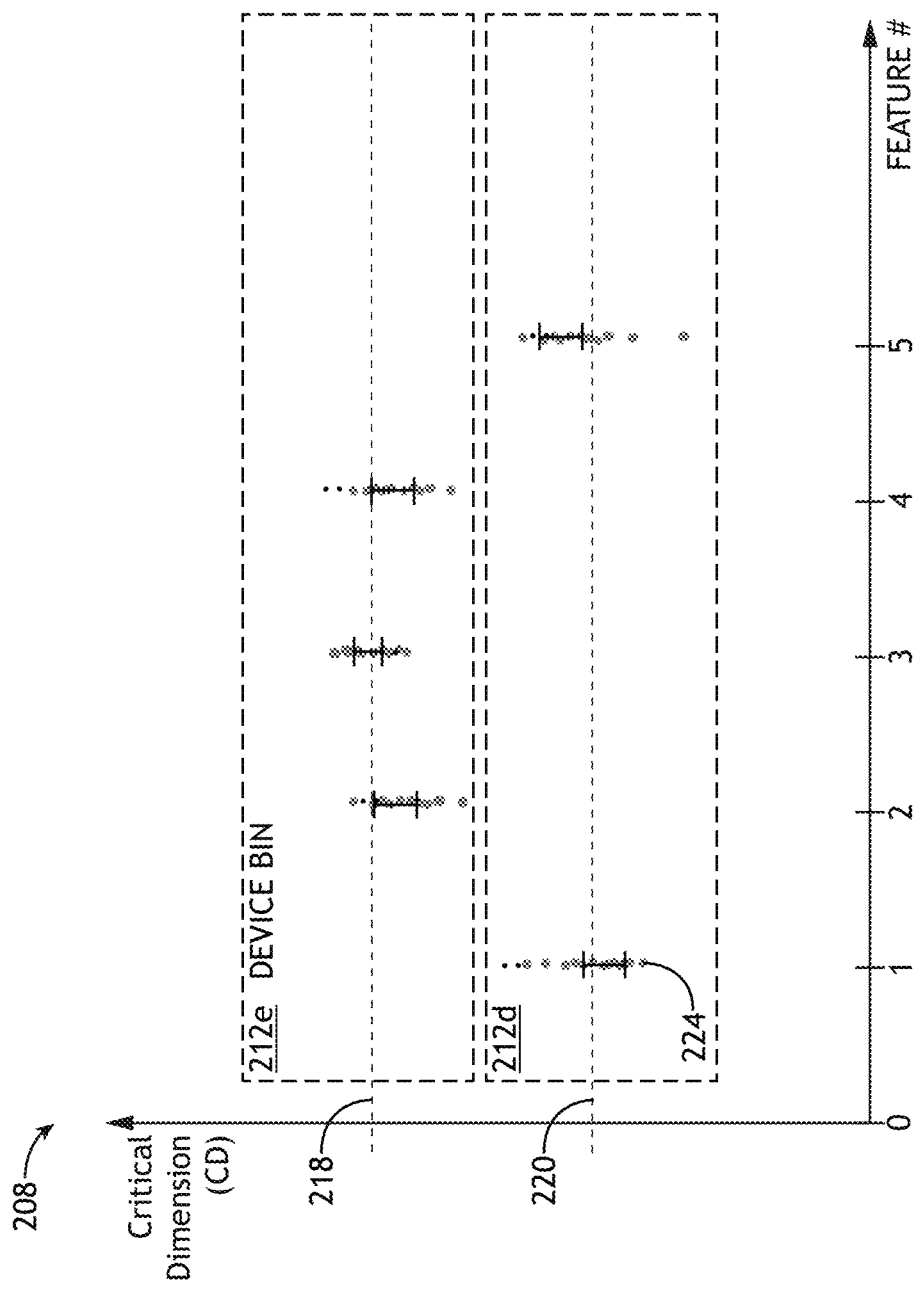
FIG. 2C is a conceptual view of device bins in the context of a plot of critical dimension measurements of device features, in accordance with one or more embodiments of the present disclosure.

As shown in FIGS. 2B and 2C, one or more groups of device features (e.g., feature #s 1 through 5 on the horizontal axes) may be binned into one or more device bins 212 (e.g., device bins 212a, 212b, 212c, 212d, 212e) based on a similarity between device feature measurements 222, 224 and target design measurements 214, 216, 218.

FIG. 2B illustrates a conceptual view of device bins 212 in the context of a plot 206 of overlay measurements 222 of device features 204, in accordance with one or more embodiments of the present disclosure. For example, device feature measurements 222 may include CD, EPE, and/or overlay measurements.

Device feature measurements 222, 224 may vary for different structural characteristics of a device feature 204 and target design measurements 214, 216 (e.g., measurements of representative metrology targets) vary for different representative metrology target designs. For example, device feature measurements may vary depending on its attributes (e.g., shape, size, location, etc.) and representative metrology target measurements may vary depending on its attributes (e.g., shape, size, etc.). For instance, overlay measurements 222 associated with feature #2 204b of FIG. 2A as plotted above the "2" on the horizontal axis of FIG. 2B may vary because of, for example, location relative to a die edge.

In embodiments, device features may be binned into device bins 212 based on a range. For example, a range of measurements may mean measurements that are on average the largest, smallest, or the like. For example, the feature #s associated with the top 40% of overlay measurements may be binned together as shown by device bin 212b. The device features with the lowest averages (e.g., lowest average, two lowest averages, and/or three lowest averages) of measurements 222 may be binned together as shown by binning feature numbers 1 and 2 in device bin 212c.

In embodiments, device features may be binned based on a mean of measurements of the device features. For example, measurements 222 of feature type number 3 of FIG. 2B may be binned into a mean distribution device bin 212a. Mean may, for example, be a mean of all measurements taken or a subset of measurements taken.

Each device bin 212 may be correlated with a target 210. For example, an overlay device bin 212b may be associated with target 210b of FIG. 2A. For instance, target measurement 214, as shown proximate to measurements 222 in FIG. 2B, may be obtained from target 210b. In this regard, target 210b may be identified as a representative metrology target of overlay device bin 212b. Similarly, target 210c (e.g., a different target) of target measurement 216 may be identified as a representative metrology target of overlay device bin 212a due to a proximity/similarity to measurements 222 of device bin 212a.

As illustrated in FIG. 2B, it is sometimes possible to identify a representative metrology target design based on a correlation (e.g., similarity) between a target design measurement 216 and device feature measurements (e.g., overlay measurements 222). In some examples, a representative metrology target may be defined by one or more target design attributes such that any target that meets such attribute criteria is considered such a target design. For example, in the case of device bin 212a in FIG. 2B, a target 210—which may include multiple targets 210a having similar target design attributes—may be the target that was used to generate target design measurement 216 (which may include multiple target design measurements 216 or be an average of multiple target design measurements). Target 210a may have one or more target design attributes selectable to be used to define a representative metrology target design. For instance, such target design attributes may be, but are not limited to, size; various grating characteristics such as pitch, shape of each grating, and the like; thickness; type (e.g., box-in-box style overlay targets, AIM style overlay targets, and the like); and any other attribute. For example, after measuring many (e.g., dozens, hundreds, thousands) of target designs, it may become apparent in an identifying step that a pitch of the gratings of the measured target designs within a particular range is correlated with a particular device bin 212. For example, target designs having such a pitch may be most closely correlated with measurements 222 of a device bin 212. In this example, the identified "representative metrology target", "representative metrology target design", and the like may be any target with the pitch.

FIG. 2C illustrates a conceptual view of device bins 212 in the context of a plot 208 of critical dimension (CD) measurements 224 of device features, in accordance with one or more embodiments of the present disclosure. For example, CD measurements 224 may be generated (e.g., measured, calculated based on data) using a first metrology sub-system 102.

As shown, device bin 212d may be an outlier device bin 212d selected as containing the device features of feature number 1 associated with measurements 224 shown within CD device bin 212d. For example, a representative metrology target with optical measurements 220 of CD may be identified based on a correlation with the CD device bin 212d.

As shown, CD device bin 212e may be selected as containing the device features of feature numbers 2 through 4 associated with measurements 224 shown within CD device bin 212e. For example, a representative metrology target may be identified based on a correlation with the CD device bin 212e. For example, the target 210 of target measurement 218 may be identified as being the representative metrology target associated with CD device bin 212e.

In embodiments, the system 100 may include one or more controllers 108. For example, the steps may individually and/or in combination, be performed on one or more controllers. For instance, the steps may be performed using different software applications stored on different computers (an example of a controller), and/or the like.

Referring again to FIGS. 1A and 1C, embodiments of various components are described in additional detail.

The controller 108 may be communicatively coupled to one or more external fabrication tools such as, but not limited to, a lithography tool. In this regard, the controller 108 may operate as an advanced process controller (APC) suitable for controlling the inputs of the external fabrication tools to maintain overlay within selected overlay tolerances.

In an optional step, overlay correctables (based on the run-time metrology measurements) are provided for a device feature area (e.g., a portion of a functional/active area of a die including device features) to a lithography tool to adjust a sample fabrication process, such as to modify exposure conditions for at least one subsequent exposure of a manufacturing process based on the run-time metrology measurements. For example, the run-time metrology measurements may include run-time metrology measurements corresponding to multiple representative metrology targets corresponding to respective device bins 212. For example, the overlay correctables could be an adjustment of any parameter, such as if overlay is misaligned by a distance, then the lithography process may be adjusted in an opposite direction to correct for the misalignment.

It is to be understood that the metrology system 100 illustrated in FIG. 1A along with the associated descriptions is provided solely for illustrative purposes and should not be interpreted as limiting. For example, the metrology system 100 may include any combination of elements illustrated in FIG. 1A. In one instance, the metrology system 100 may include a second metrology sub-system 104, a first metrology sub-system 102, and a controller 108. Further, any components of the metrology system 100 may be located proximate to each other or may be remotely located from each other. In embodiments, multiple components of the metrology system 100 may be integrated into a single physical device feature.

FIG. 1B is a conceptual view of an optical metrology tool 178 (e.g., including first metrology sub-system 104), in accordance with one or more embodiments of the present disclosure.

In embodiments, the optical metrology tool 178 and first metrology sub-system 104 includes an optical illumination source 114 to generate an optical illumination beam 116. The optical illumination beam 116 may include one or more selected wavelengths of light including, but not limited to, ultraviolet (UV) light, visible light, or infrared (IR) light.

The optical illumination source 114 may be any type of illumination source known in the art suitable for generating an optical illumination beam 116.

The optical illumination source 114 may include any type of illumination source suitable for providing an optical illumination beam 116. In embodiments, the optical illumination source 114 is a laser source. For example, the optical illumination source 114 may include, but is not limited to, one or more narrowband laser sources, a broadband laser source, a supercontinuum laser source, a white light laser source, or the like. In this regard, the optical illumination source 114 may provide an optical illumination beam 116 having high coherence (e.g., high spatial coherence and/or temporal coherence). In embodiments, the optical illumination source 114 includes a laser-sustained plasma (LSP) source. For example, the optical illumination source 114 may include, but is not limited to, a LSP lamp, a LSP bulb, or a LSP chamber suitable for containing one or more elements that, when excited by a laser source into a plasma state, may emit broadband illumination. In embodiments, the optical illumination source 114 includes a lamp source. For example, the optical illumination source 114 may include, but is not limited to, an arc lamp, a discharge lamp, an electrode-less lamp, or the like. In this regard, the optical illumination source 114 may provide an optical illumination beam 116 having low coherence (e.g., low spatial coherence and/or temporal coherence).

In embodiments, the optical illumination source 114 directs the optical illumination beam 116 to a sample 118 via an illumination pathway 120. The illumination pathway 120 may include one or more illumination pathway lenses 122 or additional optical components 124 suitable for modifying and/or conditioning the optical illumination beam 116. For example, the one or more optical components 124 may include, but are not limited to, one or more polarizers, one or more filters, one or more beam splitters, one or more diffusers, one or more homogenizers, one or more apodizers, or one or more beam shapers. The illumination pathway 120 may further include an objective lens 126 configured to direct the optical illumination beam 116 to the sample 118.

In embodiments, the sample 118 is disposed on a sample stage 128. The sample stage 128 may include any device feature suitable for positioning and/or scanning the sample 118 within the optical metrology sub-system 172. For example, the sample stage 128 may include any combination of linear translation stages, rotational stages, tip/tilt stages, or the like.

In embodiments, the optical metrology sub-system 172 includes a detector 130 configured to capture light emanating from the sample 118 through a collection pathway 132. The collection pathway 132 may include, but is not limited to, one or more collection pathway lenses 134 for collecting light from the sample 118. For example, a detector 130 may receive light reflected or scattered (e.g., via specular reflection, diffuse reflection, and the like) from the sample 118 via one or more collection pathway lenses 134. By way of another example, a detector 130 may receive light generated by the sample 118 (e.g., luminescence associated with absorption of the optical illumination beam 116, or the like). By way of another example, a detector 130 may receive one or more diffracted orders of light from the sample 118 (e.g., 0-order diffraction, ±1 order diffraction, ±2 order diffraction, and the like).

The detector 130 may include any type of detector known in the art suitable for measuring illumination received from the sample 118. For example, a detector 130 may include, but is not limited to, a multipixel detector such as a CCD detector, a CMOS detector, or the like. In embodiments, a detector 130 may include a spectroscopic detector suitable for identifying wavelengths of light emanating from the sample 118.

The collection pathway 132 may further include any number of optical elements to direct and/or modify collected illumination from the sample 118 including, but not limited to one or more collection pathway lenses 134, one or more filters, one or more polarizers, or one or more beam blocks.

In embodiments, the detector 130 is positioned approximately normal to the surface of the sample 118. In embodiments, the optical metrology sub-system 172 includes a beamsplitter 136 oriented such that the objective lens 126 may simultaneously direct the optical illumination beam 116 to the sample 118 and collect light emanating from the sample 118. Further, the illumination pathway 120 and the collection pathway 132 may share one or more additional elements (e.g., objective lens 126, apertures, filters, or the like).

The optical metrology sub-system 172 may measure overlay based on any technique known in the art such as, but not limited to, imaged-based techniques or scatterometry-based techniques. For example, the optical metrology sub-system 172 operating in an imaging mode may illuminate a portion of the sample 118 and capture an image of the illuminated portion of the sample 118 on a detector 130. The captured image may be any type of image known in the art such as, but not limited to, a brightfield image, a darkfield image, a phase-contrast image, or the like. Further, captured images may be stitched together (e.g., by the optical metrology sub-system 172, by the controller 108, or the like) to form a composite image of the sample 118. By way of another example, the optical metrology sub-system 172 may scan a focused optical illumination beam 116 across the sample 118 and capture light and/or particles emanating from the sample 118 on one or more detectors 130 at one or more measurement angles to generate an image pixel by pixel. The focused optical illumination beam 116 may be scanned across the sample 118 by modifying the beam path (e.g., using a galvo mirror, a piezo-electric mirror, or the like) and/or by translating the sample 118 through a focal volume of the focused beam. Accordingly, overlay associated with two or more sample layers may be determined based on the relative positions of features located on the two or more sample layers.

By way of another example, the optical metrology sub-system 172 may operate as a scatterometry-based metrology sub-system by determining overlay based on the pattern of light scattered and/or diffracted from the sample 118 in response to the optical illumination beam 116. For example, optical metrology sub-system 172 may capture (e.g., with the detector 130) one or more pupil plane images (e.g., of different regions of an overlay target) including the angular distribution of light emanating from the sample. Accordingly, overlay between two or more sample layers may be determined from the pupil plane images based on modeled scattering and/or diffraction from overlay target features having known sizes and distributions for each layer.

Further, the optical metrology sub-system 172 may measure overlay at any fabrication step by having the optical illumination beam 116 propagate through a current layer to interact with features on one or more previously fabricated layers such that the signal received by the detector 130 (e.g., an image of the sample 118, an image of a pupil plane, or the like) is indicative of the overlay between at least two layers. For example, the optical metrology sub-system 172 may measure overlay between a previously-fabricated layer and a current layer as an after-development inspection (ADI) step after the exposure of the current layer. In this regard, an overlay measurement of the current layer and any previous layers may be generated based on differences in the refractive index of exposed features with respect to unexposed features. By way of another example, the optical metrology sub-system 172 may measure overlay between a previously-fabricated layer and a current layer as an after-etching inspection (AEI) step after a developed pattern has been etched into the current layer as a relief structure.

FIG. 1C is a conceptual view of a particle-beam metrology tool 176, in accordance with one or more embodiments of the present disclosure. The particle-beam metrology sub-system 174 of the particle-beam metrology tool 176 is an example of a first metrology sub-system 102 and may include, for example, a scanning electron microscope (SEM) metrology sub-system 102.

The first metrology sub-system 102 may make measurements at any fabrication step. For example, first metrology sub-system 102 may measure between a previously-fabricated layer and a current layer as an after-development inspection (ADI) step after the exposure and/or development of the current layer. By way of another example, the first metrology sub-system 102 may measure between a previously-fabricated layer and a current layer as an after-etching inspection (AEI) step after a developed pattern has been etched into the current layer as a relief structure.

In embodiments, the particle-beam metrology sub-system 174 includes a particle source 138 (e.g., an electron beam source, an ion beam source, or the like) to generate a particle beam 140 (e.g., an electron beam, an ion beam, or the like). The particle source 138 may include any particle source known in the art suitable for generating a particle beam 140. For example, the particle source 138 may include, but is not limited to, an electron gun or an ion gun. In embodiments, the particle source 138 is configured to provide a particle beam 140 with a tunable energy. For example, particle source 138 including an electron source may, but is not limited to, provide an accelerating voltage in the range of 0.1 kV to 30 kV. As another example, a particle source 138 including an ion source may, but is not required to, provide an ion beam with an energy in the range of 1 to 50 keV.

In embodiments, the particle-beam metrology sub-system 174 includes one or more particle focusing elements 142. For example, the one or more particle focusing elements 142 may include, but are not limited to, a single particle focusing element or one or more particle focusing elements forming a compound system. In embodiments, the one or more particle focusing elements 142 include a particle objective lens 144 configured to direct the particle beam 140 to the sample 118 located on a sample stage 146. Further, the one or more particle source 138 may include any type of electron lenses known in the art including, but not limited to, electrostatic, magnetic, uni-potential, or double-potential lenses.

In embodiments, the particle-beam metrology sub-system 174 includes at least one particle detector 148 to image or otherwise detect particles emanating from the sample 118. In embodiments, the particle detector 148 includes an electron collector (e.g., a secondary electron collector, a backscattered electron detector, or the like). In embodiments, the particle detector 148 includes a photon detector (e.g., a photodetector, an x-ray detector, a scintillating element coupled to photomultiplier tube (PMT) detector, or the like) for detecting electrons and/or photons from the sample surface.

It is to be understood that the description of a particle-beam metrology tool 176 as depicted in FIG. 1C and the associated descriptions above are provided solely for illustrative purposes and should not be interpreted as limiting. For example, the particle-beam metrology tool 176 may include a multi-beam and/or a multi-column system suitable for simultaneously interrogating a sample 118. In a further embodiment, the particle-beam metrology tool 176 may include one or more components (e.g., one or more electrodes) configured to apply one or more voltages to one or more locations of the sample 118. In this regard, the particle-beam metrology tool 176 may generate voltage contrast imaging data.

It is recognized herein that the penetration depth of the particle beam 140 in the sample 118 may depend on the particle energy such that higher-energy beams typically penetrate deeper into the sample 118. In embodiments, the particle-beam metrology sub-system 174 utilizes different particle energies to interrogate different layers of the device feature based on the penetration depth of the particle beam 140 into the sample 118. For example, the particle-beam metrology sub-system 174 may utilize a relatively low-energy electron beam (e.g., approximately 1 keV or less) and may utilize a higher energy beam (e.g., approximately 10 keV or higher) to characterize a previously fabricated layer. It is recognized herein that the penetration depth as a function of particle energy may vary for different materials such that the selection of the particle energy for a particular layer may vary for different materials.

The optically-resolvable features and the device feature-scale features of a hybrid overlay target may have any orientation or distribution in the hybrid overlay target suitable for providing both optical and device feature-scale overlay in the same direction or directions. In embodiments, the optically-resolvable features and the device feature-scale features are physically separated. For example, optical metrology targets with embedded device-scale features are generally described in U.S. Pat. No. 9,093,458 titled "DEVICE CORRELATED METROLOGY (DCM) FOR OVL WITH EMBEDDED SEM STRUCTURE OVERLAY TARGETS" issued on Jul. 28, 2015, which is incorporated herein by reference in its entirety. In embodiments, at least some of the optically-resolved features of the hybrid overlay target are segmented with a device-scale pitch. In this regard, the optical overlay measurements and the device-scale overlay measurements may be performed in the same physical location, which may provide increased accuracy of the overlay tool error. For example, segmented targets having optically-resolvable features and device-scale features are generally described in U.S. Patent Publication No. US 2014/0307256 titled "Process Compatible Segmented Targets and Design Methods" and published on Oct. 16, 2014, which is incorporated herein by reference in its entirety.

By way of another example, targets 210 may include periodic structures (e.g., periodically-distributed features in one or more directions). It is recognized herein that targets having periodic features in one or more layers may provide multiple measurement locations. For example, overlay may be measured relative to any of the periodic elements. In this regard, targets having periodic elements in one or more layers may thus enhance the accuracy and/or throughput of an overlay measurement (e.g., either an optical overlay measurement or a device feature-scale overlay measurement of device feature-scale features). For instance, at a given dose of illumination associated with the overlay measurement (e.g., deposited energy per area on a sample), overlay measurements of periodic features based on the multiple measurement locations may have a higher accuracy than an overlay measurement based on a single measurement location (e.g., a single feature). In another instance, a given overlay measurement accuracy may be obtained using a lower dose of illumination when based on the multiple measurement locations compared to an overlay measurement based on a single measurement location. It is further recognized herein that reducing the dose of illumination required to perform an overlay measurement may mitigate damage of the sample 118 and/or increase measurement throughput.

It is recognized herein that overlay errors may be introduced at nearly every stage of fabrication and may vary spatially across the sample or temporally from one sample to the next or from one lot of samples to the next in a production run. For example, a lithography tool (e.g., a stepper, a scanner, or the like) may typically have a field of view smaller than a full sample and may thus divide the sample into a series (e.g., a grid) of exposure fields that may be separately exposed. Grid errors associated with misalignments of a reticle to the sample during an exposure step of one or more exposure fields may contribute to overlay errors that vary spatially across the sample. Additionally, aberrations in the lithography tool during exposure (e.g., lens aberrations, turbulence associated with heat, or the like) may result in spatially-varying pattern placement errors within a single exposure field. By way of another example, overlay errors may include process errors associated with the fabrication of three-dimensional structures on the sample based on the exposed patterns. Process errors may include, but are not limited to, distortions of an exposed pattern during lithography, etch-induced errors, polishing errors, or errors associated with variations in the sample. As a result, overlay measured at an overlay target may be subject to spatially-varying target-to-device feature errors based on the displacement between the overlay target and the device features.

Overlay targets may generally be placed at any location on the sample according to a metrology recipe. However, the size, orientation, and/or density of features in a target may influence target placement. For example, overlay targets having optically-resolvable features are typically placed in scribe lines between dies of a sample in order to reserve space within the dies for device features and/or because optically-resolvable features may not adhere to process design rules. By way of another example, overlay targets having features that adhere to process design rules may typically be placed within sample dies near device features of interest or within the scribe lines.

As noted previously herein, the one or more processors 110 of the controller 108 may be communicatively coupled to memory 112, wherein the one or more processors 110 may be configured to execute a set of program instructions maintained in memory 112, and the set of program instructions may be configured to cause the one or more processors 110 to carry out various functions and steps of the present disclosure.

It is noted herein that the one or more components of metrology system 100 may be communicatively coupled to the various other components of metrology system 100 in any manner known in the art. For example, the one or more processors 110 may be communicatively coupled to each other and other components via a wireline (e.g., copper wire, fiber optic cable, and the like) or wireless connection (e.g., RF coupling, IR coupling, WiMax, Bluetooth, 3G, 4G, 4G LTE, 5G, and the like). By way of another example, the controller 108 may be communicatively coupled to one or more components of metrology system 100 via any wireline or wireless connection known in the art.

In embodiments, the one or more processors 110 may include any one or more processing elements known in the art. In this sense, the one or more processors 110 may include any microprocessor-type device configured to execute software algorithms and/or instructions. In embodiments, the one or more processors 110 may consist of a desktop computer, mainframe computer system, workstation, image computer, parallel processor, or other computer system (e.g., networked computer) configured to execute a program configured to operate the metrology system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 110. In general, the term "processor" may be broadly defined to encompass any device having one or more processing elements, which execute program instructions from memory 112. Moreover, different subsystems of the metrology system 100 (e.g., optical metrology sub-system 172, device-scale metrology sub-system 174, controller 108, user interface 170, and the like) may include processor or logic elements suitable for carrying out at least a portion of the steps described throughout the present disclosure. Therefore, the above description should not be interpreted as a limitation on the present disclosure but merely an illustration.

The memory 112 may include any storage medium known in the art suitable for storing program instructions executable by the associated one or more processors 110 and the data received from the metrology system 100. For example, the memory 112 may include a non-transitory memory medium. For instance, the memory 112 may include, but is not limited to, a read-only memory (ROM), a random-access memory (RAM), a magnetic or optical memory (e.g., disk), a magnetic tape, a solid-state drive and the like. It is further noted that the memory 112 may be housed in a common controller housing with the one or more processors 110. In an alternative embodiment, the memory 112 may be located remotely with respect to the physical location of the processors 110, controller 108, and the like. In embodiments, the memory 112 maintains program instructions for causing the one or more processors 110 to carry out the various steps described through the present disclosure.

In embodiments, the user interface 170 is communicatively coupled to the controller 108. The user interface 170 may include, but is not limited to, one or more desktops, tablets, smartphones, smart watches, or the like. In embodiments, the user interface 170 includes a display used to display data of the metrology system 100 to a user. The display of the user interface 170 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 170 is suitable for implementation in the present disclosure. In embodiments, a user may input selections and/or instructions responsive to data displayed to the user via a user input device of the user interface 170.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, device, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, device, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:
   a first metrology sub-system configured to have a first resolution;
   a second metrology sub-system configured to have a second resolution that is lower than the first resolution; and
   one or more controllers communicatively coupled to the first metrology sub-system and the second metrology sub-system and comprising one or more processors configured to execute program instructions configured to:
   perform a training comprising:
      receiving first metrology data for a plurality of device features from the first metrology sub-system;

generating first metrology measurements of the device features based on the first metrology data;

binning the device features into two or more device bins based on the first metrology measurements; and identifying representative metrology targets for the two or more device bins based on distributions of the first metrology measurements, wherein each of the representative metrology targets is selected to provide that second metrology measurements based on second metrology data from the second metrology sub-system for the representative metrology targets are representative of the first metrology measurements of the device features in the corresponding two or more device bins; and perform a run-time operation comprising:

receiving run-time metrology data of the representative metrology targets on one or more run-time samples from the second metrology sub-system; and generating run-time metrology measurements of the representative metrology targets on the one or more run-time samples based on the run-time metrology data.

2. The metrology system of claim 1, further comprising determining a threshold breach based on a monitoring of the run-time metrology measurements; and directing a transmission indicative of the threshold breach.

3. The metrology system of claim 1, wherein the identifying the representative metrology targets associated with each device bin based on the distributions of the first metrology measurements comprises:

designing the representative metrology targets.

4. The metrology system of claim 3, wherein the designing of the representative metrology targets comprises:

designing a particular representative metrology target to comprise an array of repeating device features.

5. The metrology system of claim 1, wherein the identifying the representative metrology targets associated with each device bin based on the distributions of the first metrology measurements comprises:

receiving candidate target metrology data of a plurality of candidate representative metrology targets; and selecting the representative metrology targets from the plurality of the candidate representative metrology targets based on the candidate target metrology data.

6. The metrology system of claim 1, wherein the binning of the device features into the two or more device bins based on the first metrology measurements comprises:

identifying one or more sets of the device features based on one or more ranges of values of the first metrology measurements; and binning the one or more sets of the device features into one or more outlier device bins.

7. The metrology system of claim 6, wherein the one or more sets of the device features comprise an outlier set based on an outlier range of the one or more ranges of the values of the first metrology measurements.

8. The metrology system of claim 7, wherein the outlier range comprises an outlier range of CD values.

9. The metrology system of claim 7, wherein the outlier range comprises an outlier range of OVL values.

10. The metrology system of claim 6, wherein a range of the one or more ranges is based on a peak in a distribution of the values of the first metrology measurements.

11. The metrology system of claim 6, wherein two or more of the one or more ranges are each based on a respective peak in a distribution of the values of the first metrology measurements.

12. The metrology system of claim 1, wherein the training is configured to be performed during after-etch inspection (AEI).

13. The metrology system of claim 1, wherein the run-time operation is configured to be performed during after-etch inspection (AEI).

14. The metrology system of claim 1, wherein the training is configured to be performed during after-develop inspection (ADI).

15. The metrology system of claim 1, wherein the run-time operation is configured to be performed during after-develop inspection (ADI).

16. The metrology system of claim 1, wherein the training is configured to be performed during after-develop inspection (ADI), and wherein the run-time operation is configured to be performed during after-etch inspection (AEI).

17. The metrology system of claim 1, wherein the training is configured to be performed during after-etch inspection (AEI), and wherein the run-time operation is configured to be performed during after-develop inspection (ADI).

18. The metrology system of claim 1, further comprising determining a threshold breach based on a monitoring of the run-time metrology measurements; and directing a transmission indicative of the threshold breach, wherein the monitoring comprises monitoring a run-time edge placement error (EPE) distribution determined based on the run-time metrology measurements.

19. The metrology system of claim 1, wherein the second metrology sub-system comprises a spectroscopic ellipsometer (SE) sub-system.

20. The metrology system of claim 1, wherein the second metrology sub-system comprises at least one of:

an SE sub-system configured for multiple angles of illumination;

an SE sub-system configured for measuring Mueller matrix elements;

a single-wavelength ellipsometer sub-system;

a beam profile ellipsometer sub-system;

a beam profile reflectometer sub-system;

a broadband reflective spectrometer sub-system;

a single-wavelength reflectometer sub-system;

an angle-resolved reflectometer sub-system;

an imaging sub-system; or a scatterometer sub-system.

21. The metrology system of claim 1, wherein the first metrology sub-system comprises a scanning electronic microscope (SEM) sub-system.

22. The metrology system of claim 1, wherein the binning of the device features into the two or more device bins based on the first metrology measurements comprises:

determining one or more device feature attribute distributions of the device features based on the first metrology measurements; and binning the device features into the two or more device bins based on the one or more device feature attribute distributions.

23. The metrology system of claim 22, wherein the one or more device feature attribute distributions comprise OVL distributions.

24. The metrology system of claim 22, wherein the one or more device feature attribute distributions comprise CD distributions.

25. The metrology system of claim 22, wherein the one or more device feature attribute distributions comprise edge placement error (EPE) distributions.

26. The metrology system of claim 22, wherein the one or more device feature attribute distributions comprise sample tilt distributions.

27. The metrology system of claim 1, the training further comprising:
receiving optical calibration measurements of the representative metrology targets via the second metrology sub-system;
verifying a correlation between the optical calibration measurements of the representative metrology targets and measurements of a device bin associated with the representative metrology targets; and
determining a calibration between the optical calibration measurements and the measurements of the device bin associated with the representative metrology targets.

28. The metrology system of claim 27, wherein the correlation comprises an ADI-to-AEI correlation between the optical calibration measurements and the measurements of the device bin, wherein the optical calibration measurements are configured to be after-develop inspection (ADI) measurements and the measurements of the device bin are configured to be after-etch inspection (AEI) measurements.

29. The metrology system of claim 1, wherein the metrology system is configured to provide correctables to a lithography tool to adjust a sample fabrication process based on the run-time metrology measurements corresponding to the representative metrology targets.

30. A metrology system comprising:
one or more controllers comprising one or more processors configured to execute program instructions configured to:
perform a training comprising:
receiving first metrology data for a plurality of device features from a first metrology sub-system;
generating first metrology measurements of the device features based on the first metrology data;
binning the device features into two or more device bins based on the first metrology measurements; and
identifying representative metrology targets for the two or more device bins based on distributions of the first metrology measurements, wherein each of the representative metrology targets is selected to provide that second metrology measurements based on second metrology data from a second metrology sub-system for the representative metrology targets are representative of the first metrology measurements of the device features in the corresponding two or more device bins; and
perform a run-time operation comprising:
receiving run-time metrology data of the representative metrology targets on one or more run-time samples from the second metrology sub-system; and
generating run-time metrology measurements of the representative metrology targets on the one or more run-time samples based on the run-time metrology data.

31. A method for metrology comprising:
performing a training comprising:
receiving first metrology data for a plurality of device features from a first metrology sub-system;
generating first metrology measurements of the device features based on the first metrology data;
binning the device features into two or more device bins based on the first metrology measurements; and
identifying representative metrology targets for the two or more device bins based on distributions of the first metrology measurements, wherein each of the representative metrology targets is selected to provide that second metrology measurements based on second metrology data from a second metrology sub-system for the representative metrology targets are representative of the first metrology measurements of the device features in the corresponding two or more device bins; and
performing a run-time operation comprising:
receiving run-time metrology data of the representative metrology targets on one or more run-time samples from the second metrology sub-system; and
generating run-time metrology measurements of the representative metrology targets on the one or more run-time samples based on the run-time metrology data.

32. The method of claim 31, further comprising providing correctables to a lithography tool to adjust a sample fabrication process based on the run-time metrology measurements corresponding to the representative metrology targets.

* * * * *